United States Patent [19]

Kogure et al.

[11] Patent Number: 5,148,349
[45] Date of Patent: Sep. 15, 1992

[54] ELECTRONIC PART MOUNTABLE ON THE SURFACE OF A PRINTED CIRCUIT BOARD AND METHOD OF MOUNTING THE SAME

[75] Inventors: Hiroshi Kogure; Hidehiko Norimatsu, both of Tokyo, Japan

[73] Assignee: NEC Corporation, Tokyo, Japan

[21] Appl. No.: 637,557

[22] Filed: Jan. 4, 1991

[30] Foreign Application Priority Data

Jan. 8, 1990 [JP] Japan .................................. 2-1802
Jan. 8, 1990 [JP] Japan .................................. 2-1805
Feb. 19, 1990 [JP] Japan .................................. 2-38885

[51] Int. Cl.$^5$ ...................... H05K 7/20; H01L 23/16
[52] U.S. Cl. .................................. 361/383; 361/386; 361/395; 361/400; 361/416; 357/68; 357/75; 357/81
[58] Field of Search ............... 361/383, 386, 387, 388, 361/405, 395, 397, 400, 405, 416, 417, 418, 419; 357/80, 75, 68, 81

[56] References Cited

U.S. PATENT DOCUMENTS

| | | | |
|---|---|---|---|
| 4,661,887 | 4/1987 | Lin | 361/405 |
| 4,725,723 | 2/1988 | Myline, III | 361/395 |
| 4,905,123 | 2/1990 | Windle et al. | 361/388 |
| 4,946,733 | 8/1990 | Seeger, Jr. et al. | 428/209 |
| 4,982,376 | 1/1991 | Megens et al. | 361/400 |

*Primary Examiner*—Leo P. Picard
*Assistant Examiner*—Young S. Whang
*Attorney, Agent, or Firm*—Leydig, Voit & Mayer

[57] ABSTRACT

A structure of an electronic part which may be mounted on and soldered to the surface of a printed circuit board, and a method of mounting such an electronic part. While the electronic part mounted on the circuit board is operation, heat generated by the part is efficiently radiated to the ambience. Connecting terminals extending out from the electronic part are firmly soldered to the circuit board by a minimum of heat, whereby the bonding strength and the strength against shocks are enhanced. The electronic part of interest and other electronic parts neighboring it are free from damage ascriable to heat when the former has connecting terminals thereof soldered to the circuit board. When the connecting terminals of the electronic part are soldered to the circuit board by a laser beam. Other electronic parts mounted on the circuit board are prevented from being damaged by the laser beam.

7 Claims, 3 Drawing Sheets

ELECTRONIC PART MOUNTABLE ON THE SURFACE OF A PRINTED CIRCUIT BOARD AND METHOD OF MOUNTING THE SAME

BACKGROUND OF THE INVENTION

The present invention relates to a structure of an electronic part which may be mounted on and soldered to the surface of a printed circuit board, and a method of mounting such an electronic part.

It is a common practice in the electronic devices art to mount electronic parts and circuits on a single-layer or laminated printed circuit board to thereby enhance miniaturization. Especially, a current trend is toward electronic parts of the type being mountable on the surface of a printed circuit board without resorting to holes or similar means. A high-frequency power amplifying module is one of such surface-mountable electronic parts included in a portable or on-board mobile radio communication apparatus. Since a power amplifying module for this kind of application generates heat while in operation, a case thereof for housing circuitry is usually provided with a flat heat radiating plate made of metal. The heat radiating plate contacts a printed circuit board over the entire area of one major surface thereof which serves as a ground terminal. A gallium arsenide transistor is available as a power amplifying module and has various advantages such as low heat generation, high power conversion efficiency, and low power consumption.

However, conventional power amplifying modules have some problems left unsolved since they have a flat metallic heat radiating plate without exception. Specifically, since the heat radiating plate has substantial heat capacity, a great amount of heat is needed in soldering the plate to a printed circuit board as a ground electrode. Firm bonding, therefore, is not achievable with ordinary soldering methods which rely on dipping, reflow, laser beam, etc. While a special soldering arrangement capable of generating a greater amount of heat may be used, it is likely that the heat is imparted to the circuitry accommodated in the case and other electronic parts mounted on the circuit board to damage them. Further, since the heat radiating plate contacts the circuit board over the entire surface thereof, it cannot sufficiently radiate heat generated by the module to the ambience. This heats module itself and the circuit board on which the module is mounted and thereby critically deteriorates the module and circuit board as well as other electronic parts mounted on the circuit board.

Connecting terminals extending out from the power amplifying module and connected to the circuitry are soldered to the circuit board in the same manner as the heat radiating plate. For this purpose, a pattern provided on the circuit board has lands to which the connecting terminals are to be soldered. Each connecting terminal is usually implemented as a flat metallic piece and, therefore, needs a great amount of heat for soldering and increases the soldering time. Flux is apt to form bubbles between the surfaces of the flat connecting terminals and those of the lands of the pattern during soldering, reducing the bonding strength between them. Further, when the module is heavy, the weak bonding strength would prevent it from withstanding a shock ascribable to a fall, for example.

Regarding the reflow method which is one of conventional soldering methods, it can solder all the necessary electronic parts to the lands of the pattern provided on the circuit board, but the required soldering condition differs from a relatively large part to a relatively small chip. For this reason, it has been customary to solder the individual electronic parts one by one to the circuit board by reflow at the cost of efficiency. Soldering using a laser beam is successful in eliminating this problem. However, when a relatively large electronic part is to be soldered to the circuit board by a laser beam, chips neighboring the connecting terminals of the part of interest have to be prevented from being irradiated. This cannot be done unless the laser beam is turned on and off every time a connecting terminal is soldered, also resulting in inefficient operations.

SUMMARY OF THE INVENTION

It is therefore an object of the present invention to provide an electronic part which efficiently radiates heat to the ambience when mounted on the surface of a printed circuit board, and a method of mounting such a part.

It is another object of the present invention to provide an electronic part which can be rigidly soldered to a printed circuit board by a minimum of heat and thereby achieves a great bonding strength and a strength against shocks, and a method of mounting such a part.

It is another object of the present invention to provide an electronic part which can be soldered to a printed circuit board within a short period of time, and a method of mounting such a part.

It is another object of the present invention to provide an electronic part which can be soldered to a printed circuit board without the resultant heat deteriorating it or other electronic parts neighboring it, and a method of mounting such a part.

It is another object of the present invention to provide an electronic part which can be soldered to a printed circuit board by a laser beam without the laser beam irradiating other electronic parts located in the vicinity of the part of interest, and a method of mounting such a part.

A structure of an electronic part mountable on the surface of a printed circuit board of the present invention comprises a cover accommodating circuitry therein for protecting it, a plurality of connecting terminals extending out from the cover for connecting the circuitry to a surface of the printed circuit board, wherein at least one of the connecting terminals includes at least one of a hole and a notch located adjacent to at least one of an end and a side edge thereof, whereby said notches and said holes in leads of surface mountable devices increase the bonding strength and reduce the heat imparted to the circuit board and components when soldering.

Also, a method of mounting circuitry on the surface of a printed circuit board of the present invention comprises the steps of forming a connecting terminal, which extends from a covered circuit, for mounting on the surface of a printed circuit board, forming the connecting terminal so that it includes at least one of a hole or a notch located adjacent to at least one of an end or a side edge thereof, and then soldering the connecting terminal to the surface of the printed circuit board so that solder is imparted through the at least one of a hole or a notch to the printed circuit board, whereby the solder joint bonding strength is increased and heat imparted to a circuit board is decreased over that required to solder connecting terminals having no notch or hole.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 7:
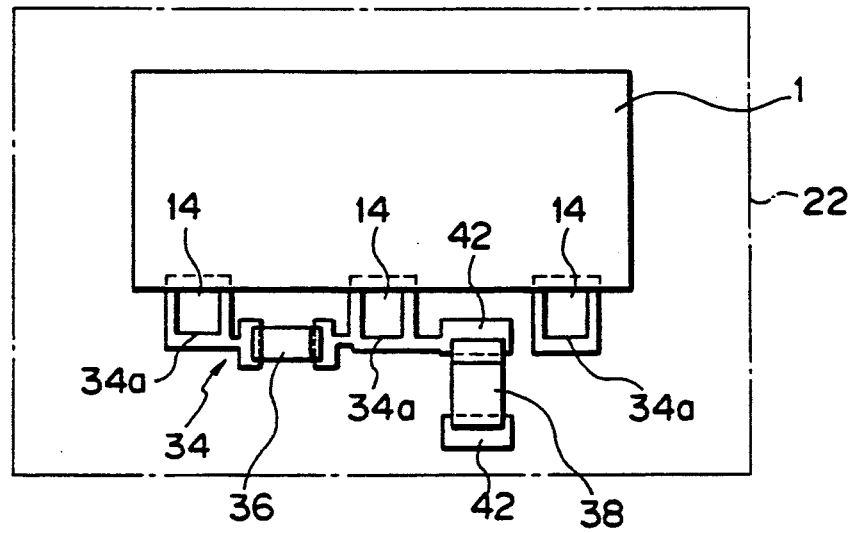
FIG. 7 is a plan view showing a conventional positional relation of electronic parts mounted on a printed circuit board to one another.

To better understand the present invention, a brief reference will be made to a conventional electronic part which may be mounted on the surface of a printed circuit board, shown in FIG. 1. As shown, the electronic part, generally 1, has a cover 12 accommodating circuitry therein, and a plurality of connecting terminals 14 each being connected to the circuitry at one end thereof. Each connecting terminal 14 is to be soldered at the other end thereof to a land of a pattern provided on a printed circuit board, as shown in FIG. 7. Since all the connecting terminals 14 are formed flat, they cannot be soldered to a printed circuit board, i.e., lands of a pattern without resorting to a great amount of heat and a substantial soldering time. Moreover, flux is apt to form bubbles between the surfaces of the terminals 14 and the surfaces of the lands. The bubbles reduce the bonding strength and the strength of the part 1 against a shock ascribable to a fall.

Figure 2:
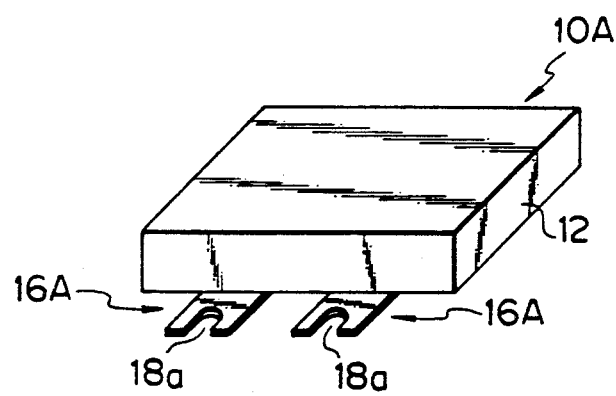
FIGS. 2 to 4 are perspective views each showing a different embodiment of the present invention.
Figure 3:
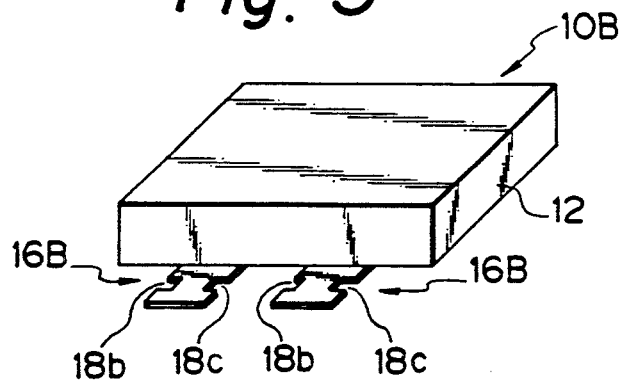
Figure 4:
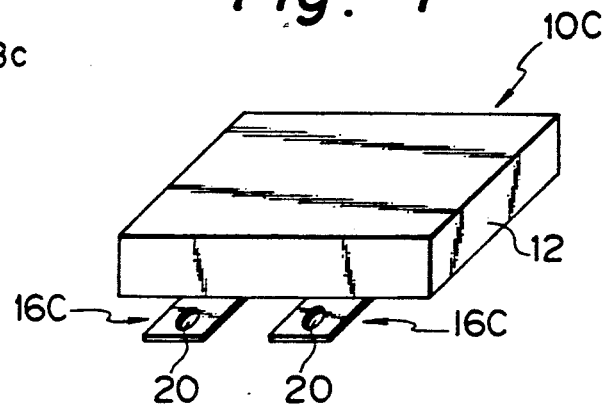

FIG. 2 shows a surface-mountable electronic part 10A embodying the present invention. As shown, the electronic part 10A has connecting terminals 16A each having at least one notch 18a at the free end thereof. FIG. 3 shows an electronic part 10B representative of an alternative embodiment of the present invention and having connecting terminals 16B each being provided with notches 18b and 18c at opposite side edges thereof. Further, FIG. 4 shows an electronic part 10C representative of a further alternative embodiment of the present invention. The electronic part 10C has connecting terminals 16C each being formed with a single hole 20 therethrough. In any of the configurations shown in FIGS. 2 to 4, melt solder enters the notches 18a, the notches 18b and 18c or the holes 20 in the event when the connecting terminals 16A, 16B or 16C are soldered to the lands of a pattern of a printed circuit board. As a result, the soldering area of each connecting terminal to the associated land and, therefore, the bonding strength is increased. The notches 18a, 18b and 18c and the holes 20 are successful in reducing the heat capacity of the associated connecting terminals 16A, 16B and 16C and, therefore, the soldering time. In addition, the notches 18a, 18b and 18c and the holes 20 serve to reduce the amount of bubbles which will be produced between the associated connecting terminals 16A, 16B and 16C and the lands of the pattern. The connecting terminals 16A, 16B and 16C each may be formed with at least one notch and at least one hole, if desired.

Figure 1:
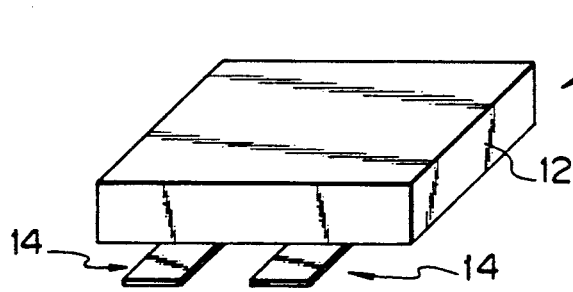
FIG. 1 is a perspective view showing a specific configuration of connecting terminals of a conventional surface-mountable conventional electronic part.
Figure 5A:
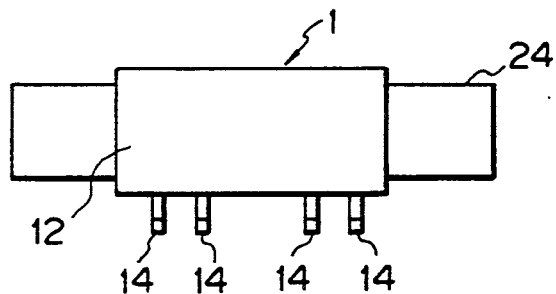
FIG. 5A is a plan view of a power amplifying module having a heat radiating plate and representative of a conventional surface-mountable electronic part.
Figure 5B:
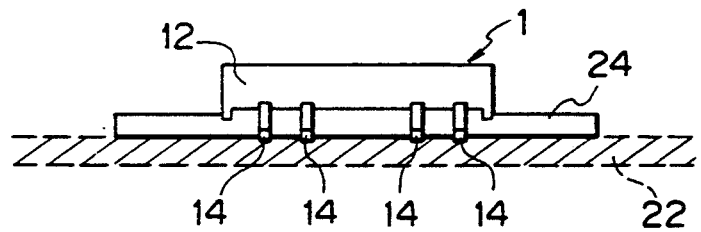
FIG. 5B is a side elevation of the module shown in FIG. 5A and mounted on a printed circuit board.

Referring to FIGS. 5A and 5B, there is shown a power amplifying module 1 which is a specific form of the conventional surface-mountable electronic part shown in FIG. 1 and implemented as a gallium arsenide transistor. The power amplifying module 1 is mounted on the surface of a printed circuit board and may advantageously serve as a power amplifying module consituting the last high-frequency signal transmission stage of a portable or on-board mobile radio communication apparatus. The module 1 has a cover 12 accommodating circuitry therein, connecting terminals 14 each being connected to the circuitry at one end thereof and soldered to a land of a pattern provided on the circuit board 22 at the other end thereof, and a flat metallic plate 24. The plate 24 plays two different roles at the same time, i.e., the role of a ground terminal for connecting the module 1 to ground and the role of a radiator for radiating heat while the module 1 is in operation. The ground terminal or radiator 24 contacts the cover 12 and circuit board 22 over the entire area of opposite surfaces thereof. To solder such a plate 24 to the circuit board 22, a substantial amount of heat is needed since it has great heat capacity. Moreover, the radiator 24 contacting the cover 12 and circuit board 22 over a substantial area thereof cannot efficiently radiate heat to the ambience while the module 1 is in operation. The heat, therefore, is apt to heat and thereby damage the module 1 itself, other electronic parts surrounding the module 1, and the entire circuit board 22.

Figure 6A:
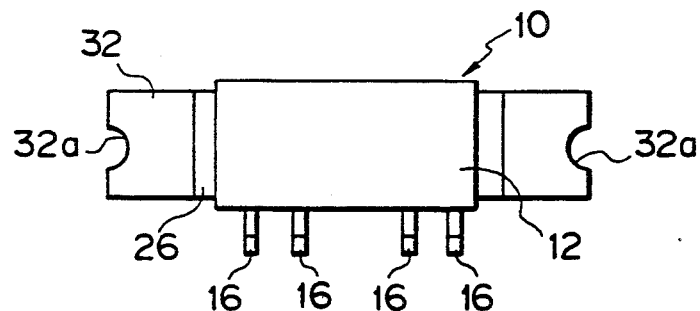
FIG. 6A is a plan view of a power amplifying module having a heat radiating plate which is a specific form of an electronic part in accordance with the present invention.
Figure 6B:
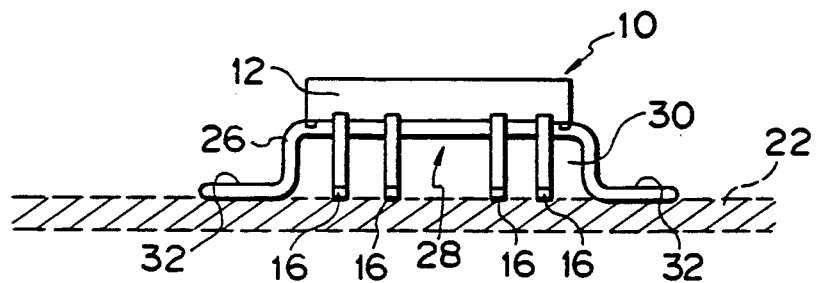
FIG. 6B is a side elevation of the module shown in FIG. 6A and mounted on a printed circuit board.

In the light of this, as shown in FIGS. 6A and 6B, the present invention uses a radiator 26 which is so bent as to contact the cover 12 at the surface of its intermediate portion 28 and not to contact the circuit board 22 at the back of the intermediate portion 28. Specifically, a space 30 maintains the intermediate portion 28 of the radiator 26 out of contact with the circuit board 22. Legs 32 extending from the intermediate portion 28 are laid on and soldered to the circuit board 22. The legs 32 each has a notch 32a for the previously stated purpose. The space 30 intervening between the circuit board 22 and the radiator 26 allows heat generated by the module 10 to be efficiently radiated to the ambience, freeing the module, surrounding electronic parts and circuit board 22 from damage ascribable to heat. The radiator 26 can be soldered to the circuit board 22 by a small amount of heat since heating the whole radiator 26 is not necessary, i.e. , it is only the notches 32a of the legs 32 that have to be heated. In this manner, the module 10 of the present invention is prevented from being heated during soldering and while in operation, whereby the module 10 itself and surrounding electronic parts are free from damage otherwise caused by heat.

Generally, electronic parts including the above-stated power amplifying module and various IC chips are soldered to a printed circuit board at connecting terminals thereof by reflow, laser beam, or similar conventional implementation. FIG. 7 shows a conventional arrangement of a power amplifying module or similar relatively large electronic part 1 and relatively small chips 36 and 38 located in the vicinity of the part 1 on the printed circuit board 22. The part 1 and the chips 36 and 38 are soldered to the lands 34a of the pattern 34 by reflow at their connecting terminals 14, 40 and 42, respectively. Regarding the reflow type method, the part 1 and chips 36 and 38 each needs a particular soldering condition and, therefore, cannot be soldered at the same time. However, mounting the individual parts one by one on the circuit board 22 while soldering their connecting terminals is not efficient. While the method using a laser beam eliminates such a problem of the reflow method, it brings about another problem when it comes to the relatively large part 1. Namely, it is likely that a laser beam for soldering the connecting terminals 14 of the part 1 to the lands 34a irradiates the chips 36 and 38 together with the part 1 of interest and thereby damages them. Hence, the laser beam has to be turned on and off every time a connecting terminal 14 is soldered.

Figure 8:
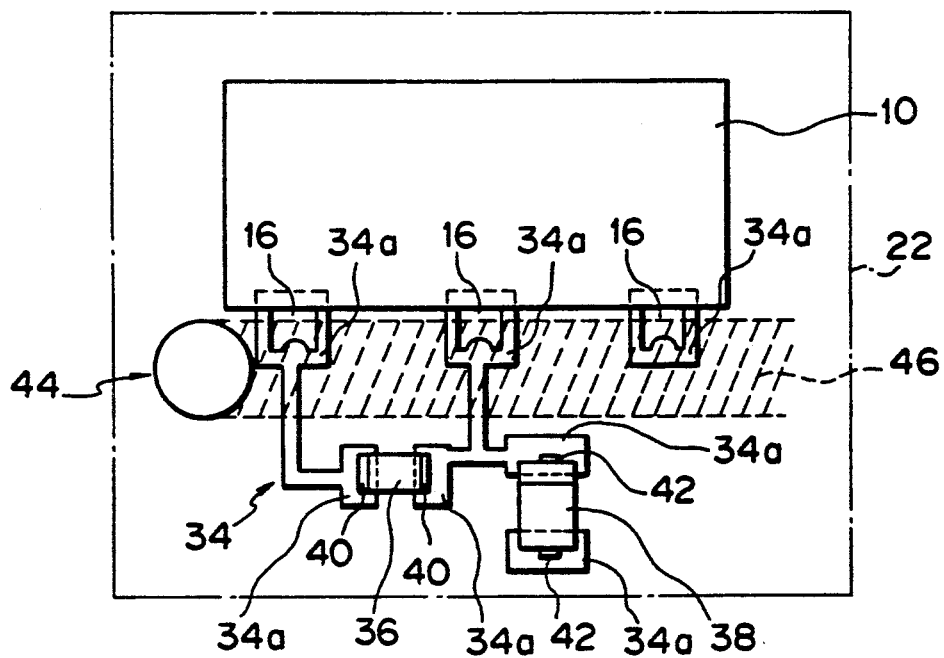
FIG. 8 is a view similar to FIG. 7, showing a positional relation particular to the present invention.

As shown in FIG. 8, in accordance with the present invention, the chips 36 and 38 are not positioned in the vicinity of the connecting terminals 16 of the part 1 which are to be irradiated by a laser beam to the lands 34a of the pattern 34. Specifically, other parts are inhibited from being arranged in a particular zone 46 on the circuit board 22 which accommodates the connecting terminals 16 and is to be swept by the beam spot 44, as indicated by hatching in the figure. The inhibition zone 46 has a width greater than the diameter of the beam spot 44. The chips 36 and 38 which should not be irradiated have their connecting terminals 40 and 42 soldered to the lands 34a of the pattern by reflow. In this configuration, the laser beam is allowed to continuously sweep the circuit board 22 over the entire zone 46. Therefore, when the methods using reflow and laser beam are used in combination to solder the connecting terminals of individual parts to the lands of a pattern provided on a printed circuit board, parts soldered by reflow are prevented from being irradiated and damaged by a laser beam.

Various modifications will become possible for those skilled in the art after receiving the teachings of the present disclosure without departing from the scope thereof.

What is claimed is:

1. A structure of an electronic part mountable on a surface of a printed circuit board comprising:
   a cover accommodating therein circuitry of said part;
   a plurality of connecting terminals extending out from said cover for connecting said circuitry to said printed circuit board; and
   a heat radiating member for radiating heat while said electronic part is in operation, said heat radiating member comprising a connecting portion to be connected to said printed circuit board and a body portion to be connected to said cover;
   wherein said plurality of connecting terminals each comprises at least one notch at one of an end and a side edge thereof whereby said notches in leads of surface mountable devices increase the bonding strength and reduce the heat imparted to the circuit board and components when soldering.

2. A structure of an electronic part mountable on a surface of a printed circuit board comprising:
   a cover accommodating therein circuitry of said part;
   a plurality of connecting terminals extending out from said cover for connecting said circuitry to said printed circuit board; and
   a heat radiating member for radiating heat while said electronic part is in operation, said heat radiating member comprising a connecting portion to be connected to said printed circuit board and a body portion to be connected to said cover;
   wherein said plurality of connecting terminals each comprises at least one hole adjacent to an end thereof whereby said holes in leads of surface mountable devices increase the bonding strength and reduce the heat imparted to the circuit board and components when soldering.

3. A structure of an electronic part mountable on a surface of a printed circuit board comprising:
   a cover accommodating therein circuitry of said part;
   a plurality of connecting terminals extending out from said cover for connecting said circuitry to said printed circuit board; and
   a heat radiating member for radiating heat while said electronic part is in operation, said heat radiating member comprising a connecting portion to be connected to said printed circuit board and a body portion to be connected to said cover;
   wherein said plurality of connecting terminals each comprises at least one notch at one of an end and a side edge thereof and at least one hole adjacent to said end whereby said notches and said holes in leads of surface mountable devices increase the bonding strength and reduce the heat imparted to the circuit board and components when soldering.

4. A structure of an electronic part mountable on a surface of a printed circuit board comprising:
   a cover accommodating therein circuitry of said part;
   a plurality of connecting terminals extending out from said cover for connecting said circuitry to said printed circuit board; and
   a heat radiating member for radiating heat while said electronic part is in operation, said heat radiating member comprising a connecting portion to be connected to said printed circuit board and a body portion to be connected to said cover;
   wherein said plurality of connecting terminals each are soldered to a land of a pattern provided on said printed circuit board by a laser beam, and
   further comprising an inhibition zone extending over a particular area of said printed circuit board to be swept by a laser beam which solders said plurality of terminals to said lands and having a width greater than a diameter of a beam spot of said laser beam, electronic parts other than said electronic part being inhibited from being arranged in said inhibition zone.

5. A method of mounting on a surface of a printed board an electronic part having a heat radiating plate which is constituted by a flat metallic member comprising the steps of:
   (a) bending said heat radiating plate to form a connecting portion at opposite ends and a body portion intermediate between said opposite ends; (b) soldering said connecting portions to lands of a pattern provided on said printed circuit board;
   (c) soldering a plurality of connecting terminals connected to circuitry of said electronic part to lands of said pattern by a laser beam; and
   (d) defining an inhibition zone over a particular area of said printed circuit board to be swept by the laser beam which solders said plurality of connecting terminals to said lands, said inhibition zone having a width greater than a diameter of a beam spot of said laser, electronic parts other than said electronic part being inhibited from being arranged in said inhibition zone.

6. A structure of an electronic part mountable on a surface of a printed circuit board comprising:
- a cover accommodating therein circuitry of said part; and
- a plurality of connecting terminals extending out from said cover for connecting said circuitry to a surface of a printed circuit board, wherein at least one of the connecting terminals includes at least one of a hole and a notch located adjacent to at least one of an end and a side edge thereof whereby said notches and said holes in leads of surface mountable devices increase the bonding strength and reduce the heat imparted to the circuit board and components when soldering.

7. A method of mounting circuitry on the surface of a printed circuit board comprising the steps of:
- forming a connecting terminal, which extends from a covered circuit, for mounting on the surface of a printed circuit board;
- forming the connecting terminal so that it includes at least one of a hole or a notch located adjacent to at least one of an end and a side edge thereof; and then
- soldering the connecting terminal to the surface of the printed circuit board so that solder is imparted through the at least one of a hole and a notch to the printed circuit board, whereby the solder joint bonding strength is increased and heat imparted to a circuit board is decreased over that required to solder connecting terminals having no notch and no hole.

* * * * *

UNITED STATES PATENT AND TRADEMARK OFFICE
CERTIFICATE OF CORRECTION

PATENT NO. : 5,148,349

DATED : September 15, 1992

INVENTOR(S) : Kogure et al.

It is certified that error appears in the above-identified patent and that said Letters Patent is hereby corrected as shown below:

On the title page:

Item [56]: References Cited, U.S. Patent Documents, change "4,725,723" to --4,725,923--.

In the Abstract, line 15, change "beam. Other" to --beam, other--.

Claim 5, column 6, line 61, after "ends;" should start a new paragraph:

--intermediate between said opposite ends;
 (b) soldering said connecting portions to
 lands of a ........etc.--.

Signed and Sealed this

Twenty-first Day of September, 1993

Attest:

Attesting Officer

BRUCE LEHMAN

Commissioner of Patents and Trademarks